United States Patent
Jaganathen

(10) Patent No.: US 9,985,247 B2
(45) Date of Patent: May 29, 2018

(54) LUMINOUS MODULE WITH FLEXIBLE ORGANIC LIGHT-EMITTING DIODE

(71) Applicant: VALEO VISION, Bobigny (FR)

(72) Inventor: Camille Jaganathen, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days. days.

(21) Appl. No.: 15/618,992

(22) Filed: Jun. 9, 2017

(65) Prior Publication Data

US 2017/0358773 A1    Dec. 14, 2017

(30) Foreign Application Priority Data

Jun. 10, 2016 (FR) ...................... 16 55331

(51) Int. Cl.
| | |
|---|---|
| H01L 51/52 | (2006.01) |
| F21S 4/22 | (2016.01) |
| H01L 25/04 | (2014.01) |
| H01L 51/56 | (2006.01) |
| H01L 51/00 | (2006.01) |
| F21Y 115/15 | (2016.01) |
| B60Q 3/74 | (2017.01) |
| B60Q 1/04 | (2006.01) |
| B60Q 1/30 | (2006.01) |

(52) U.S. Cl.
CPC .......... H01L 51/5253 (2013.01); F21S 4/22 (2016.01); F21S 41/155 (2018.01); F21S 41/28 (2018.01); F21S 43/145 (2018.01); F21S 43/26 (2018.01); H01L 25/048 (2013.01); H01L 51/0097 (2013.01); H01L 51/56 (2013.01); B60Q 1/04 (2013.01); B60Q 1/30 (2013.01); B60Q 3/745 (2017.02); *F21Y 2115/15* (2016.08); *H01L 2251/5338* (2013.01); *H01L 2251/5361* (2013.01)

(58) Field of Classification Search
CPC . H01L 51/5253; H01L 51/56; H01L 51/0097; H01L 25/048; F21S 43/145; F21S 41/155; F21S 4/22
See application file for complete search history.

(56) References Cited

U.S. PATENT DOCUMENTS

| | | |
|---|---|---|
| 2012/0168058 A1 | 7/2012 | Kim et al. |
| 2013/0034685 A1 | 2/2013 | An et al. |
| 2013/0161684 A1 | 6/2013 | Momma et al. |
| 2015/0041804 A1 | 2/2015 | Momma et al. |
| 2016/0204183 A1* | 7/2016 | Tao .................... H01L 51/0097 257/40 |
| 2016/0351838 A1 | 12/2016 | Momma et al. |

FOREIGN PATENT DOCUMENTS

| | | |
|---|---|---|
| JP | 2003-19745 | 1/2003 |
| JP | 2008-89884 | 4/2008 |
| JP | 2008-159309 | 7/2008 |

OTHER PUBLICATIONS

French Preliminary Search Report dated Feb. 6, 2017 in French Application 16 55331 filed on Jun. 10, 2016 (with English Translation of Categories of Cited Documents).

* cited by examiner

*Primary Examiner* — Fei Fei Yeung Lopez
(74) *Attorney, Agent, or Firm* — Oblon, McClelland, Maier & Neustadt, L.L.P.

(57) ABSTRACT

The invention relates to a flexible organic light-emitting diode. The diode includes at least one curved part, of which at least one portion is covered with a layer of varnish.

20 Claims, 2 Drawing Sheets

LUMINOUS MODULE WITH FLEXIBLE ORGANIC LIGHT-EMITTING DIODE

The invention belongs to the field of interior and/or exterior lighting and/or signaling devices for a motor vehicle, and it particularly concerns luminous modules comprising flexible organic light-emitting diodes.

The invention relates to a curved organic light-emitting diode. It also relates to the luminous module comprising the curved organic light-emitting diode. Lastly, the invention also relates to the method for shaping an organic light-emitting diode.

An organic light-emitting diode, known in particular by its acronym OLED, is conventionally composed of a substrate on which an emitting assembly is arranged, this assembly being formed by two electrodes (an anode and a cathode) between which at least one emission layer made of an organic electroluminescent material is placed. The excitation, by applying an electrical voltage between the two electrodes, of the emission layer makes it possible to emit light rays through the substrate at the exit of the diode.

Organic light-emitting diodes are being used more and more in the automotive field, both to carry out the lighting or signaling function of the vehicle per se, and for aesthetic functions, and in particular a visual and luminous signature of the vehicle by producing three-dimensional lighting and/or signaling styles. In this application for motor vehicles, it is known to arrange the organic light-emitting diodes with an emitting part, generally arranged facing a cover lens of a headlamp, and a connection part by which this luminous module is connected to a device for electrical supply and control of the lighting and/or signaling device of the vehicle.

The organic light-emitting diodes used in headlamps of motor vehicles may consist of rigid organic light-emitting diodes, having a glass substrate, or of flexible organic light-emitting diodes, that is to say ones which can assume a curvature and no longer extend only in a plane, with a substrate made of plastic material.

The use of a flexible organic light-emitting diode has the advantage that it can be folded or rolled easily and thus offers enhanced possibilities for the creation of a style particular to the vehicle on which these specific light sources are fitted.

However, the integration of these flexible organic light-emitting diodes into lighting modules is difficult because it is complicated to configure them in a predefined shape without impairing their lighting performance, refinement and aesthetic appearance. However, this configuration of the flexible organic light-emitting diode is necessary at least in order to ensure stability of the shape of the light source over time, and therefore constancy of the lighting function.

The object of the present invention is to overcome the drawbacks described above by conceiving a flexible organic light-emitting diode which can be shaped easily in order to produce a three-dimensional lighting and/or signaling style.

According to the invention, a flexible organic light-emitting diode is characterized in that it comprises at least one curved part, of which at least one portion is covered with a layer of varnish.

At least one portion covered with varnish is intended to include both the fact that the flexible organic light-emitting diode may have a layer of varnish produced pointwise on a single region of the diode, or alternatively on a plurality of regions, and that for each of these regions the layer of varnish may be applied onto one or other of the faces of the diode.

The varnish is used in order to facilitate long-term maintenance of the deformation of the flexible organic light-emitting diode when it is in a second shape comprising an additional curved part compared with a first shape or initial shape of the flexible organic light-emitting diode.

According to one characteristic of the invention, the layer of varnish covering the portion may have a thickness which is variable as a function of the radius of curvature of the curved part. In this case, the thickness of the layer of varnish may depend on the radius of curvature of the curved part of the flexible organic light-emitting diode at a given point.

According to one aspect of the invention, the thickness of the layer of varnish is commensurately greater when the radius of curvature of the curved part is small. In other words, the thickness of the layer of varnish at a given point of said at least curved part of the flexible organic light-emitting diode is commensurately greater when the radius of curvature of said at least one curved part of the flexible organic light-emitting diode at this given point, when the light-emitting diode is in the second shape, is small.

Irrespective of whether the varnish is deposited homogeneously or discontinuously, provision may be made for the thickness of the layer of varnish to be less than or equal to the thickness of the flexible organic light-emitting diode.

Independently of the exemplary embodiment selected, the invention has at least one of the following characteristics, considered separately or in combination:
- the portion covered with a layer of varnish is a portion that emits light, and in this case, in particular, the varnish is transparent or translucent;
- the portion covered with a layer of varnish is a portion that does not emit light, and in this case, in particular, the varnish is opaque;
- the varnish is photosensitive and/or heat-sensitive;
- the flexible organic light-emitting diode is in the form of a sheet comprising an emitting face and a non-emitting face, and in this case provision may be made for the varnish to be deposited only on the non-emitting face;
- the flexible organic light-emitting diode comprises at least one electrical connection part and/or at least one mechanical holding part;
- the electrical connection part and the mechanical holding part have a common location on the flexible light-emitting diode;
- the electrical connection part is formed by one or more connection elements;
- the holding part is formed by one or more holding elements.

The invention also relates to a luminous module comprising at least one flexible organic light-emitting diode as specified above.

Provision may, in particular, be made for the luminous module to comprise a diode support, and for the flexible organic light-emitting diode to be held on this support by one or two of its edges. Advantageously, the flexible organic light-emitting diode is held on this support only on the edge or said two edges.

Optionally, the luminous module comprises a cover lens through which at least a fraction of the flexible organic light-emitting diode is visible, the portion of the curved part covered with the layer of varnish extending only in this visible fraction of the flexible organic light-emitting diode. In this case, provision may be made for the portion of the curved part covered with the layer of varnish to be without an electrical connection element of the flexible organic light-emitting diode and/or a mechanical holding element of the flexible organic light-emitting diode.

Advantageously, the luminous module is arranged as a luminous module of a motor vehicle, in particular as a device for lighting or signaling or lighting the interior of a motor vehicle. Optionally, the flexible organic light-emitting diode is capable of participating in all or some of a function of lighting, signaling or lighting the interior of the motor vehicle.

The invention furthermore relates to a method for shaping a flexible organic light-emitting diode, in particular a flexible organic light-emitting diode as presented above.

The method comprises a first step consisting in providing a flexible organic light-emitting diode, a second processing step comprising at least one step of applying a varnish to at least one portion of the flexible organic light-emitting diode, and a third stiffening step consisting in stiffening the varnish in order to keep the flexible organic light-emitting diode in a predetermined shape.

According to a series of characteristics of the invention, taken separately or in combination, provision may be made that:
- the light-emitting diode in the first step has a first shape, the third stiffening step consisting in keeping the flexible organic light-emitting diode in a predetermined second shape which is different to the first shape and is attained during the second step;
- the second shape has at least one additional curve compared with the first shape;
- the first shape of the flexible organic light-emitting diode is a flat shape;
- the second shape is a flat shape contained in a plane, and particularly in the same plane as the plane defined by the first shape of the flexible organic light-emitting diode; or alternatively the second shape is curved, and in particular is circumscribed in a plurality of secant planes, while having for example at least partly a ruled surface;
- the second processing step furthermore comprises a step of shaping the flexible organic light-emitting diode according to the predetermined second shape; and provision may be made that this shaping step is carried out before or after the step of applying the varnish;
- the shaping step comprises a first substep of gripping the flexible organic light-emitting diode according to the first shape by means of at least two gripping means, in particular pliers, and a substep of moving one of the gripping means relative to another of the gripping means in order to shape the flexible organic light-emitting diode according to the second shape;
- the shaping step may comprise a substep, in particular a third substep, of protecting at least one electrical connection and/or mechanical holding part of the flexible organic light-emitting diode, for example by applying a mask onto said at least one electrical connection and/or mechanical holding part, in order to avoid covering this at least one part with varnish. As a variant, the protection step may be simultaneous with the gripping step, the gripping of the flexible organic light-emitting diode by the gripping means being carried out at said at least one electrical connection and/or mechanical holding part;
- the step of applying the varnish is a step of applying the varnish onto said at least one portion of the organic light-emitting diode with the aid of a brush or a pad roller;
- the step of applying the varnish is a step of spraying the varnish onto said at least portion of the organic light-emitting diode;
- the step of applying the varnish is a step of immersing said at least portion of the organic light-emitting diode in a bath of varnish;
- the step of applying the varnish is a step of evaporating varnish onto said at least one portion of the organic light-emitting diode;
- the step of stiffening the varnish is a step of crosslinking the varnish, for example by means of UV rays, by drying following an increase in the surrounding temperature.

Other characteristics and advantages of the present invention will become clearer with the aid of the description and the drawings, in which.

Figure 1:
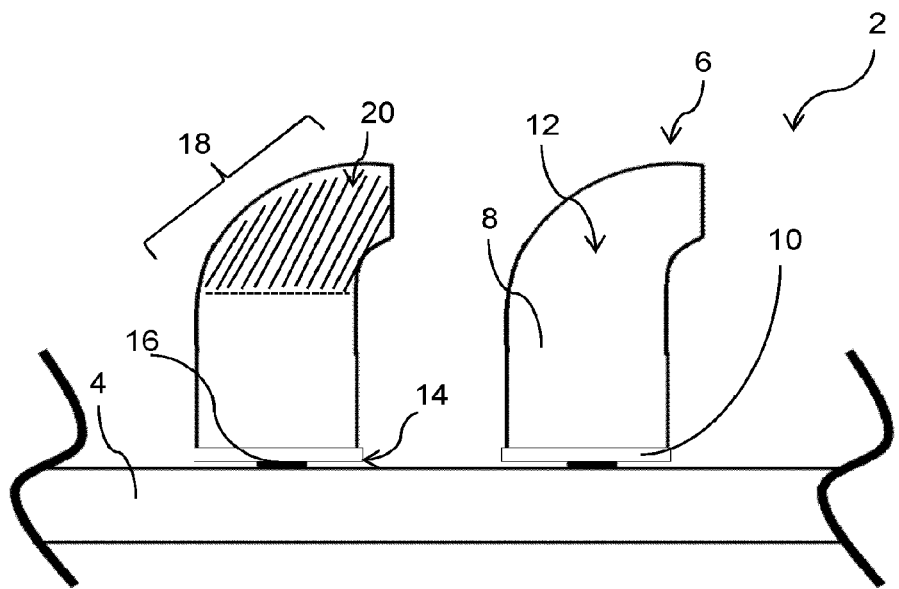
FIG. 1 is a front view of two flexible organic light-emitting diodes arranged on a common support contained in a luminous module, according to a first embodiment of the invention.

FIG. 1 partially represents a luminous module 2 comprising a support 4, common to a plurality of flexible organic light-emitting diodes 6, in particular two as represented.

This luminous module 2 may be used both in a front headlamp and in a tail light of a vehicle, and it may furthermore be used in devices for interior lighting of the passenger compartment of the vehicle.

The common support 4 is configured in order to receive the flexible organic light-emitting diode or diodes 6, and in order to be fixed to the structure of the lighting device in which it is installed.

The flexible organic light-emitting diode 6 comprises an emitting part 8 and a connection part 10, making it possible to hold the diode on the common support 4 and electrically connect the emitting part 8 to a device (not represented here) for electrical supply and/or control of all the flexible organic light-emitting diodes 6 in the luminous module 2. At least the emitting part 8 is formed on a plastic substrate allowing it to be deformed and curved along one or more directions.

The emitting part 8 of the flexible organic light-emitting diode 6 is configured in the shape of a sheet having two separate faces, of which there is an emitting first face 12 and an opposite second face 13.

Provision may be made that the opposite second face 13 is also emissive, or alternatively that only the first face 12 is emissive, that is to say the light rays emitted by the flexible organic light-emitting diode emerge only through this first face 12. Furthermore, in variants which are not represented, it will be understood that the flexible organic light-emitting diode could, without departing from the context of the invention, assume a form other than the form of a sheet described in the present embodiment, and that it could have more than two faces, of which one or more faces could the emissive.

The connection part 10 may also be formed on the basis of a substrate made of plastic material, and advantageously the same as that used for the emitting part 8, or alternatively it may be produced with an insulating material which is mechanically stiffer, for example and without limitation glass or polymer resin. According to the embodiment more particularly illustrated in the figures, it is at least on one edge 14 of the flexible organic light-emitting diode 6 in the form of a substantially parallelepipedal plate. In the embodiment illustrated, the emitting part 8 of the flexible organic light-emitting diode 6 extends from one side of the connection part 10, and a connector 16, configured in order to cooperate with connection means arranged in the common support 4, extends from the connection part 10 opposite the emitting part 8. The connector 16 is in this case configured in order to carry out the mechanical fastening of the flexible organic light-emitting diode 6 and the electrical connection to the network of the vehicle. It may be noted that the mechanical fastening of the organic light-emitting diode is carried out in a floating fashion, that is to say the diode is mechanically held on only one edge, at least two edges being left free. In this case, the elements forming the mechanical holding part and the elements forming the electrical connection part are all located on the same edge.

The flexible organic light-emitting diode 6 according to the invention comprises at least one curved part 18, here formed opposite the connection part 10. This curved part 18 comprises at least one portion 20 covered with a layer of varnish, which is represented schematically in the figures by hatching. The portion 20 covered with a layer of varnish is, in the embodiment illustrated in FIG. 1, contained in the emitting part 8 of the flexible organic light-emitting diode 6.

As will be described in more detail below, particularly in the description of the way of obtaining the flexible light-emitting diode configured according to the invention, the layer of varnish makes it possible to fix the curved configuration of the organic light-emitting diode. In order to obtain such an effect provision may be made that the portion covered with a layer of varnish extends equally well on one and/or the other of the faces 12, 13 of the emitting part. The choice of applying the layer of varnish onto one and/or the other of the faces of the emitting part may, in particular, depend on the light-ray emission capacity of each of these faces. In the case in which both faces of the emitting part are emissive, the layer of varnish may arbitrarily be arranged on one and/or the other of the faces. In the case in which only the first face 12 is emissive, the layer of varnish may advantageously be arranged on the non-emitting opposite second face 13.

The layer of varnish present on the portion 20 of the curved part 18 may have a variable thickness along this portion 20, in particular as a function of the radius of curvature of the curved part 18. In other words, the thickness of the layer of varnish at a given point of the portion 20 depends on the radius of curvature of the curved part 18 at this point. Thus, referring in particular to the examples illustrated in FIG. 2, the thickness of the layer of varnish on the portion 20 is greater in the vicinity of the first point P1 than in the vicinity of the second point P2, the radius of curvature of the curved part 18 being less at the first point P1 than at the second point P2.

The thickness of the layer of varnish on the portion 20 is less than the thickness of the flexible organic light-emitting diode 6.

The varnish is advantageously translucent, in particular when the portion 20 that it covers extends over the emitting first face 12. It will be understood that, according to another embodiment, the varnish may be opaque, in particular when the portion 20 covered with a layer of varnish extends over a non-emitting face, or alternatively over a region of an emitting face 12 not configured in order to allow emergence of the light rays from the flexible organic light-emitting diode 6.

The varnish has photosensitive and/or heat-sensitive properties. The properties of the varnish vary following exposure to ultraviolet "UV" radiation and/or as a function of temperature. In particular, the varnish undergoes cross-linking under the action of a catalyst such as heat or UV radiation. The varnish is thus capable of passing from a first state, in which it can be applied easily onto one and/or the other of the faces of the flexible organic light-emitting diode, into a second state in which it has a hardening effect on the portion 20, and in particular on the curved part 18, making it possible to keep the flexible organic light-emitting diode 6 according to a predetermined shape. According to the invention, the application of the layer of varnish onto the flexible organic light-emitting diode 6 makes it possible to configure the latter according to a desired configuration while stiffening it without the risk of damaging the structure of the flexible organic light-emitting diode 6.

Provision may in particular be made that the varnish is, for example, a thermosetting varnish GQ 20-0880 from BASF. Such varnishes are conventionally used in order to correct defects on optical surfaces. This varnish may be applied as a layer onto a portion of the flexible organic light-emitting diode formed, in particular, from polyimide.

Figure 2:
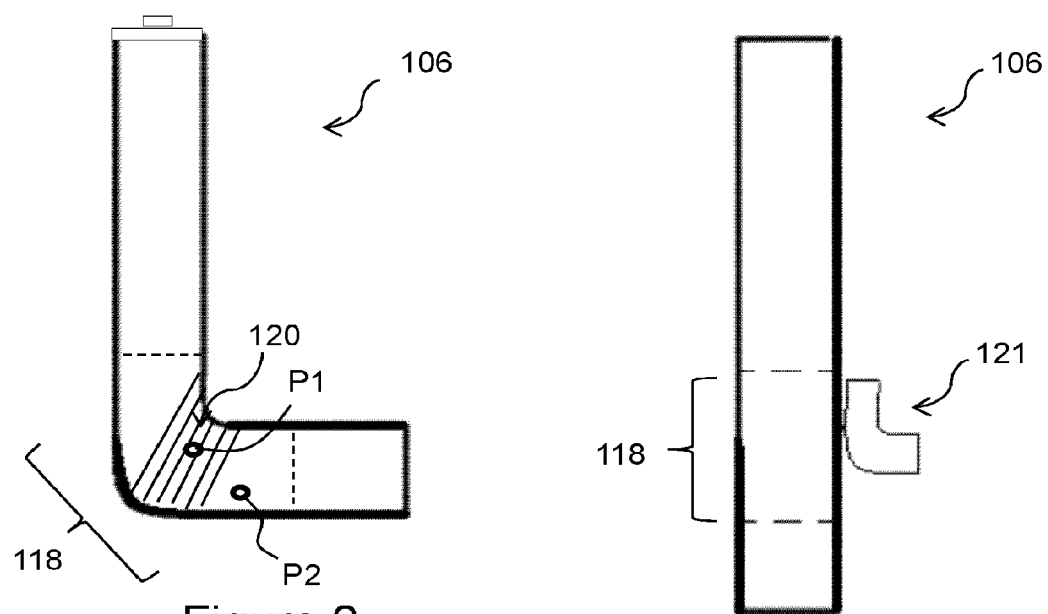
FIG. 2 is a front view of the organic light-emitting diode according to a second embodiment of the invention.

FIGS. 1 and 2 illustrate two embodiments differing by the size of the portion 20 covered with a layer of varnish. In FIG. 1, the flexible organic light-emitting diode 6 has a curved part 18 at the end of the emitting part 8, and the portion 20 covered with a layer of varnish extends over the entire curved part. The flexible organic light-emitting diode 106 of FIG. 2 differs by the location of the curved part 118 and above all by the fact that the portion 120 covered with a layer of varnish corresponds to a region having a surface area less than that of the curved part 118, so that the curved part is in this case partially covered with a layer of varnish. In FIG. 2*b* is, the flexible organic light-emitting diode 106 is illustrated in its first shape, or original shape, in which it is flat and straight, this diode being made to come in contact with a corner 121 against which it is rolled in order to assume the curved shape, in the plane defined by the first shape of the diode, which is illustrated in FIG. 2. The first shape and the predetermined second shape of the diode are circumscribed in the same plane, and the second shape has at least one additional curved part compared with the first shape.

Figure 3:
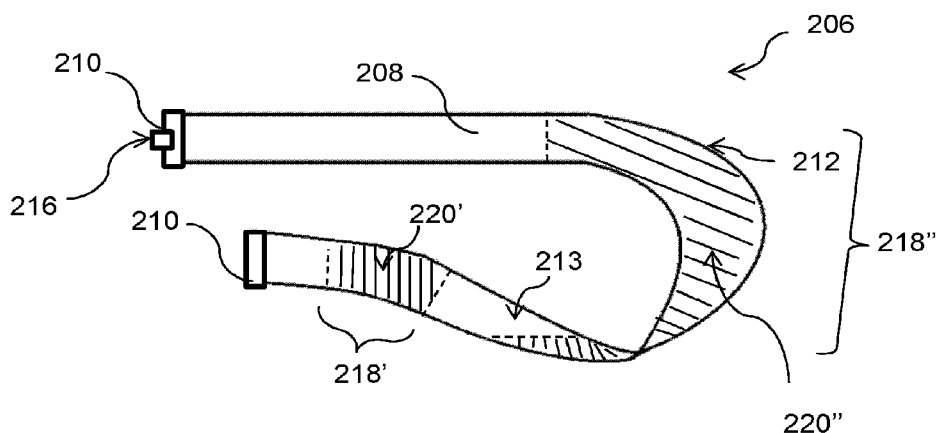
FIG. 3 is a front view of the organic light-emitting diode according to a third embodiment of the invention.

FIG. 3 represents a third embodiment of the invention, according to which the flexible organic light-emitting diode 206 differs from the previously illustrated diodes in that, on the one hand, it does not extend in a single plane by assuming a flat shape, as is the case in particular with the diode 106 illustrated in FIG. 2, and in that on the other hand it has two curved parts 218, 218'. As illustrated, the diode 206 is configured according to a shaping method described below so that the final shape, that is to say a predetermined second shape different to the original first shape, is curved and circumscribed in a plurality of secant planes. The final shape of the diode may be obtained by a succession of foldings carried out so that the diode at least partly has a ruled surface.

The flexible organic light-emitting diode 206 in this case comprises two connection parts 210, each located on one of two opposite end edges of the diode. According to the embodiment, one of the two connection parts 210 or both connection parts 210 may comprise a connector 216 as defined above in order to mechanically fix and/or electrically connect the flexible organic light-emitting diode 206. As before, the flexible organic light-emitting diode 206 is held in a floating fashion, that is to say with at least two free edges.

The flexible organic light-emitting diode 206 comprises an emitting part 208 with two emitting faces 212, 213, and the two curved parts 218, 218' are formed in the emitting part. The first and second curved parts 218', 218" respectively have a first portion 220' and a second portion 220", which are respectively covered with a first layer of varnish and with a second layer of varnish. The varnish applied onto these curved parts 218', 218" is transparent or translucent, allowing light rays to pass through.

The first curved part 218' has a radius of curvature less than the radius of curvature of the second curved part 218", and according to what was described above, the thickness of the layer of varnish on the first portion 220' is greater than the thickness of the layer of varnish on the second portion 220".

Embodiments of a method for shaping a flexible organic light-emitting diode as presented above will now be described, with reference in particular to FIGS. 4 and 4'.

The method for shaping the flexible organic light-emitting diode comprises a first step 1000 of gripping a flexible organic light-emitting diode, during which a flexible diode is placed in an arrangement suitable for carrying out the subsequent operations, then a second processing step 2000 comprising a step of shaping and a step of applying the varnish, and a third step 3000 of stiffening the varnish.

It will be understood that the step of applying the varnish could be repeated several times according to requirements as a function of the desired thickness of the layer of varnish, and that these additional varnish application steps could take place before or after the third step 3000 of stiffening.

Figure 4:
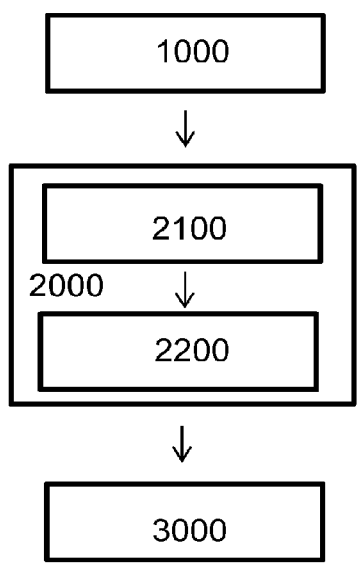
FIG. 4 represents two flow charts, each illustrating a sequence of steps carried out during a shaping method according to the invention.
Figure 4:
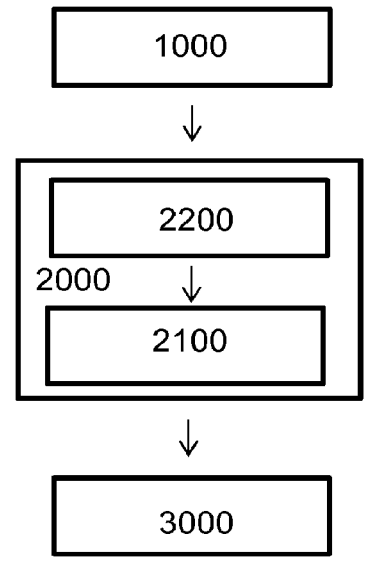

The second processing step 2000 may differ from a first shaping method illustrated in FIG. 4 to a second shaping method illustrated in FIG. 4' in that it consists either in the succession of a shaping step 2100 followed by a step 2200 of applying the varnish, or in the succession of a step 2200 of applying the varnish followed by a shaping step 2100.

One of the two methods will, in particular, be preferred to the other as a function of the properties of the varnish which is applied, in particular the stiffening time.

In each of the two cases, the shaping step consists in creating the second shape, or final shape, of the flexible light-emitting diode. It may comprise a first substep of gripping the flexible organic light-emitting diode according to the first shape by means of at least two gripping means, in particular with the aid of pliers. This gripping substep is followed by a substep consisting in moving at least one of the gripping means, or simultaneously all the gripping means, in order to deform the flexible diode by this relative movement with respect to one another of edges of the diode which are held by the gripping means and in proportions calculated in order to shape the flexible organic light-emitting diode according to the desired second shape. Depending on the embodiment, this shaping step may comprise a third so-called protection substep consisting in protecting one or more electrical connection and/or mechanical holding parts of the flexible organic light-emitting diode. In order to do this, during this protection substep, a mask is applied onto said electrical connection and/or mechanical holding parts in order to avoid covering these parts with varnish, the varnish being capable of preventing good connection and/or good holding of the light-emitting diode. According to one embodiment, the protection step may be simultaneous with the gripping step, the gripping of the flexible organic light-emitting diode by the gripping means then being carried out at said electrical connection and/or mechanical holding parts, so that the gripping means fulfill the function of the mask mentioned above.

The application 2200 of the varnish onto at least one portion of the flexible organic light-emitting diode may be carried out according to various operating modes selected from spraying, immersion in a bath of varnish, evaporation or application with the aid of a brush, a pad or a roller.

It will be known to select one or other of the operating modes in particular as a function of the location of the portion or portions to be covered with varnish and as a function of the accessibility of these portions. By way of example, immersion in a bath of varnish will be favored only if all of the emitting part is to be covered with varnish.

A control module defines the varnish spraying region and the thickness of the layer of varnish to be sprayed, as a function of the first shape in which the flexible light-emitting diode arrives in the first step of the method, before shaping and application of varnish, and as a function of the predetermined second shape to be given to the diode.

The step 3000 of stiffening the varnish is the final step of the shaping method, consisting in a step of crosslinking the varnish by means of a catalyst. The varnish will thus be stiffened, for example as a result of UV radiation or a variation in temperature, in particular an increase in the temperature. The stiffening time may vary as a function of the amount of varnish applied in the preceding step onto the portion of the curved part of the diode.

The invention claimed is:

1. Flexible organic light-emitting diode, wherein the diode comprises at least one curved part, of which at least one portion is covered with a layer of varnish.

2. Flexible organic light-emitting diode according to claim 1, wherein the thickness of the layer of varnish covering the portion is variable as a function of the radius of curvature of the curved part.

3. Flexible organic light-emitting diode according to claim 1, wherein the thickness of the layer of varnish is less than or equal to the thickness of the flexible organic light-emitting diode.

4. Flexible organic light-emitting diode according to claim 1, wherein the at least one portion covered with a layer of varnish is a portion that emits light.

5. Flexible organic light-emitting diode according to claim 1, wherein the varnish is transparent or translucent.

6. Flexible organic light-emitting diode according to claim 1, wherein the at least one portion covered with a layer of varnish is a portion that does not emit light.

7. Flexible organic light-emitting diode according to claim 1, wherein the diode is in the form of a sheet comprising an emitting face and a non-emitting face.

8. Flexible organic light-emitting diode according to claim 7, wherein the portion covered with a layer of varnish is a portion of the non-emitting face.

9. Luminous module comprising at least one curved flexible organic light-emitting diode according to claim 8.

10. Method for shaping a flexible organic light-emitting diode, comprising a first step consisting in providing a flexible organic light-emitting diode, a second processing step comprising at least one step of applying a varnish to at least one portion of the flexible organic light-emitting diode, and a third stiffening step consisting in stiffening the varnish in order to keep the flexible organic light-emitting diode in a predetermined shape.

11. Shaping method according to claim 10, wherein a flexible organic light-emitting diode is provided according to a first shape in the first step, and in that the third stiffening step consists in keeping the flexible organic light-emitting diode in a predetermined second shape which is different to the first shape.

12. Shaping method according to either claim 10, wherein the second processing step furthermore comprises a step of shaping the flexible organic light-emitting diode according to the predetermined second shape.

13. Shaping method according to claim 12, wherein the shaping step is carried out before the step of applying the varnish.

14. Shaping method according to claim 12, wherein the shaping step is carried out after the step of applying the varnish.

15. Shaping method according to claim 10, wherein the step of applying the varnish is a step of spraying the varnish onto said at least portion of the flexible organic light-emitting diode.

16. Flexible organic light-emitting diode according to claim 2, wherein the thickness of the layer of varnish is less than or equal to the thickness of the flexible organic light-emitting diode.

17. Flexible organic light-emitting diode according to claim 2, wherein the at least one portion covered with a layer of varnish is a portion that emits light.

18. Flexible organic light-emitting diode according to claim 2, wherein the varnish is transparent or translucent.

19. Flexible organic light-emitting diode according to claim 2, wherein the at least one portion covered with a layer of varnish is a portion that does not emit light.

20. Flexible organic light-emitting diode according to claim 2, wherein the diode is in the form of a sheet comprising an emitting face and a non-emitting face.

* * * * *